United States Patent
Wu

Patent Number: 5,888,904
Date of Patent: Mar. 30, 1999

[54] METHOD FOR MANUFACTURING POLYSILICON WITH RELATIVELY SMALL LINE WIDTH

[75] Inventor: Kuo-Chien Wu, Maio Li, Taiwan

[73] Assignee: Holtek Microelectronics Inc., Taiwan

[21] Appl. No.: 991,083

[22] Filed: Dec. 16, 1997

[30] Foreign Application Priority Data

Aug. 1, 1997 [TW] Taiwan ................... 86111034

[51] Int. Cl.$^6$ .................................. H01L 21/44
[52] U.S. Cl. .................. 438/682; 438/684; 438/948; 438/949
[58] Field of Search .................. 438/682, 948, 438/949, 684, 346, 351

[56] References Cited

U.S. PATENT DOCUMENTS

| | | |
|---|---|---|
| 5,213,992 | 5/1993 | Lu . |
| 5,512,500 | 4/1996 | Oyamatsu . |
| 5,523,258 | 6/1996 | Petti et al. . |
| 5,525,534 | 6/1996 | Ikemasu et al. . |
| 5,789,300 | 8/1998 | Fulford, Jr. . |

FOREIGN PATENT DOCUMENTS 404103162  4/1992  Japan .

*Primary Examiner*—John F. Niebling
*Assistant Examiner*—Josetta I. Jones
*Attorney, Agent, or Firm*—Knobbe, Martens, Olson & Bear, LLP

[57] ABSTRACT

A method is provided for manufacturing a polysilicon with a relatively small line width. The method includes steps of: a) forming a first layer of photoresist with a line pattern having a first line interval and a first line width over the polysilicon; b) etching a portion of the polysilicon for forming the polysilicon with a second line interval x and a second line width y respectively equal to the first line interval and the first line width; c) forming a second layer of photoresist with a third line interval and a third line width over the polysilicon; d) etching another portion of the polysilicon for forming the polysilicon with a fourth line interval x', equal to the third line interval, and a fourth line width y'; e) depositing a polysilicon film over the polysilicon with the relatively small line width; and f) etching a portion of the polysilicon film to form sidewalls of the polysilicon with the relatively small line width for adjusting the relatively small line width of the polysilicon.

14 Claims, 4 Drawing Sheets

METHOD FOR MANUFACTURING POLYSILICON WITH RELATIVELY SMALL LINE WIDTH

FIELD OF THE INVENTION

The present invention is related to a method for manufacturing a polysilicon with a relatively small line width.

BACKGROUND OF THE INVENTION

Referring to FIG. 1 and FIG. 2, the conventional method for manufacturing a polysilicon with a small line width includes steps of: 1) forming an insulator 11 on a substrate 10; 2) depositing a polysilicon 12 on the insulator 11 by chemical vapor deposition (CVD); 3) coating a layer of photoresist 13 on the polysilicon 12 and then forming the photoresist with a pattern having an interval x and a width y after exposure and development of photolithography; 4) removing a portion of the polysilicon 12 that is not covered by the photoresist 13 by etching technique to form the polysilicon 12 with the same pattern. However, the minimum interval x and line width y of the polysilicon depends on the smallest pattern which can be developed by photolithography and etched by etching technique. In order to fabricate the polysilicon with relatively small interval x and line width y, it requires a preferable photolithography technology. Up to the present day, the photolithographis process for manufacturing the polysilicon with small line width includes: a) using I-line (365 nm) matched with the photoresist with high resolution; b) using the phase-shifting mask; and c)using deep UV (248 nm). Nevertheless, although the photolithography using short wavelength and phase-shifting mask can be used for manufacturing a polysilicon with small line width, there are some demerits described as follows:

1. The costs for the instrument of photolithography with short wavelength and the phase-shifting mask are very expensive.
2. The phase-shifting mask is not easily fabricated.

SUMMARY OF THE INVENTION

An object of the present invention is to provide a method for manufacturing a polysilicon with a relatively small line width.

According to the present invention, the method includes steps of: a) forming a first layer of photoresist with a line pattern having a first line interval and a first line width over the polysilicon; b) etching a portion of the polysilicon for forming the polysilicon with a second line interval x and a second line width y respectively equal to the first line interval and the first line width; c) forming a second layer of photoresist with a third line interval and a third line width over the polysilicon; d) etching another portion of the polysilicon for forming the polysilicon with a fourth line interval x' which is equal to the third line interval, and a fourth line width y'; e) depositing a polysilicon film over the polysilicon with relatively small line width; and f) etching a portion of the polysilicon film to form sidewalls of the polysilicon with relatively small line width for adjusting the small line width of the polysilicon.

In accordance with one aspect of the present invention, the insulator is made of one of oxide and nitride.

In accordance with another aspect of the present invention, the polysilicon is a polycide.

In accordance with another aspect of the present invention, the polycide is formed by chemical vapor deposition (CVD).

In accordance with another aspect of the present invention, the polycide is formed by physical vapor deposition (PVD).

In accordance with another aspect of the present invention, the first layer of photoresist is formed by photolithography.

In accordance with another aspect of the present invention, a light source used for photolithography is one selected from a group consisting of G-line, I-line, Deep UV, and X-ray.

In accordance with another aspect of the present invention, the second layer of photoresist is formed by photolithography using a mask.

In accordance with another aspect of the present invention, the third line interval and the third line width of the second layer of photoresist are equal to the first line interval and the first line width respectively.

In accordance with another aspect of the present invention, the second layer of photoresist with the third line interval and the third line width is formed after horizontally shifting the mask by a distance (x+y)/2.

In accordance with another aspect of the present invention, the fourth line interval x' and the fourth line width y' of the polysilicon are equal to the second line interval x and a line width (y-x)/2 respectively.

In accordance with another aspect of the present invention, the relatively small line width of the polysilicon is ranged from 0.08 $\mu$m to 0.5 $\mu$m.

In accordance with another aspect of the present invention, the polysilicon film has a thickness ranged from 50 Å to 1000 Å.

In accordance with another aspect of the present invention, the sidewalls of the polysilicon is formed by anisotropic etch.

Another object of the present invention is to provide a method for forming a polysilicon with a relatively small line width on a wafer having a substrate forming thereon an insulator.

The present invention may best be understood through the following description with reference to the accompanying drawings, in which:

DETAILED DESCRIPTION OF THE PREFERRED EMBODIMENT

According to the present invention, the method for manufacturing a polysilicon with relatively small line width includes steps of: a) providing a substrate and forming an insulator over the substrate; b) forming a polysilicon on the insulator; c) forming a first layer of photoresist with a line pattern having a first line interval and a first line width over the polysilicon by photolithography; d) etching a portion of the polysilicon for forming the polysilicon with a second line interval x and a second line width y respectively equal to the first line interval and the first line width; e) forming a second layer of photoresist with a third line interval and a third line width over the polysilicon; f) etching another portion of the polysilicon for forming the polysilicon with a fourth line interval x', equal to the third line interval, and a fourth line width y'; g) depositing a polysilicon film over the polysilicon with relatively small line width; and h) etching a portion of the polysilicon film to form sidewalls of the polysilicon with relatively small line width for adjusting the line width of the polysilicon.

Figure 1:
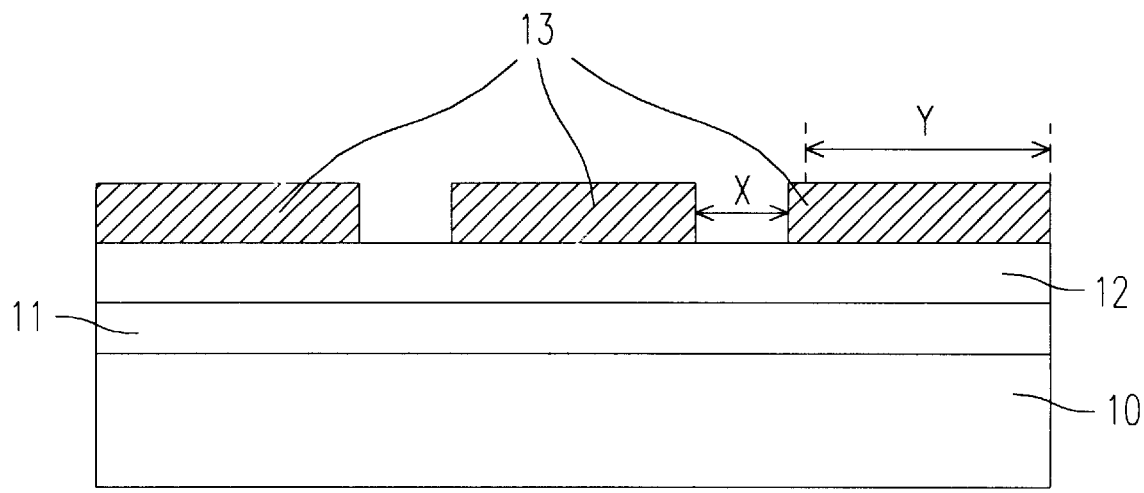
FIGS. 1 and 2 are schematic diagrams showing a conventional method for manufacturing a polysilicon with small line width.
Figure 2:
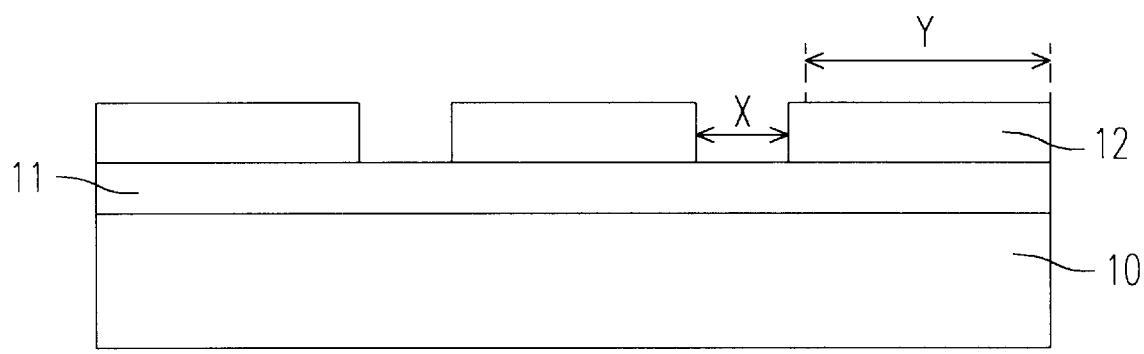
Figure 3:
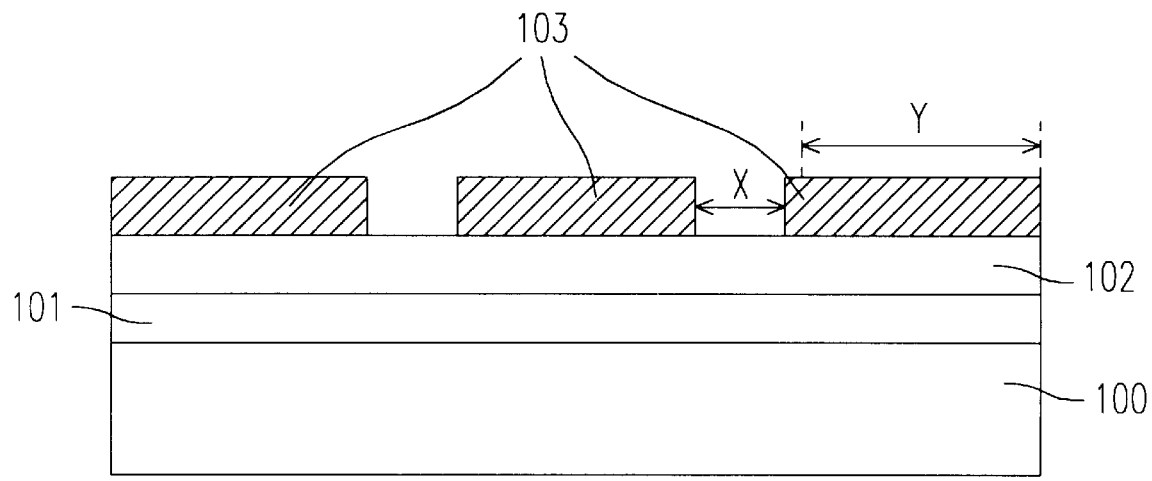
FIGS. 3~8 are schematic diagrams showing a method for manufacturing a polysilicon with relatively small line width according to the present invention.

In order to further understand the method of the present invention, please refer to FIGS. 3~8 showing a preferred embodiment of the manufacturing process of the present invention. The method are illustrated by an example as follow:

As shown in FIG. 3, the steps include: a) forming an insulator 101 over a substrate 100 and then forming a polysilicon 102 on the insulator 101; and b) forming a photoresist 103 with an interval x of 0.4 $\mu$m and a linewidth y of 0.9 $\mu$m over the polysilicon 102 after exposure and subsequent development of the first photolithographic process. The polysilicon 102 can be a polycide, formed by physical vapor deposition (PVD) or chemical vapor deposition (CVD). The thickness of the insulator 101 is ranged from 30 Å to 500 Å and that of the polysilicon 102 is ranged from 500 Å to 500 Å. The insulator 101 can be made of oxide and nitride.

Figure 4:
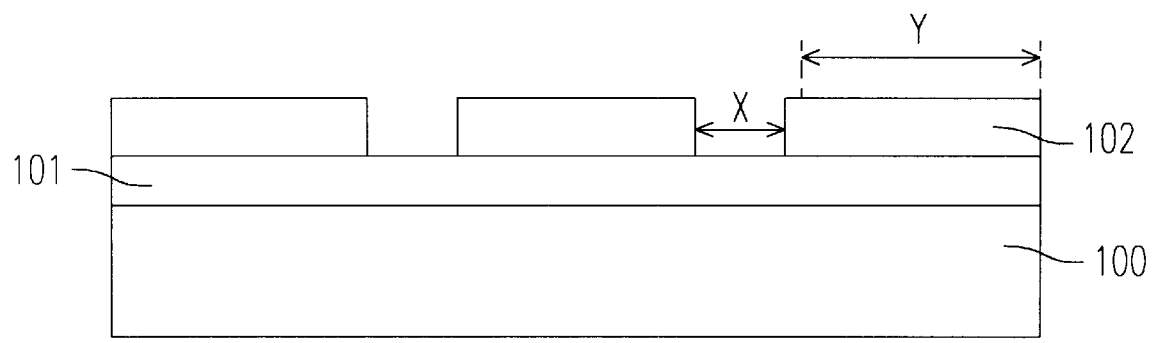

FIG. 4 shows a step to remove a portion of the polysilicon 102 that is not covered by the photoresist 103 by suitable etching techniques to form the polysilicon 102 with the same interval x (0.4 $\mu$m) and same linewidth y(0.9 $\mu$m).

Figure 5:
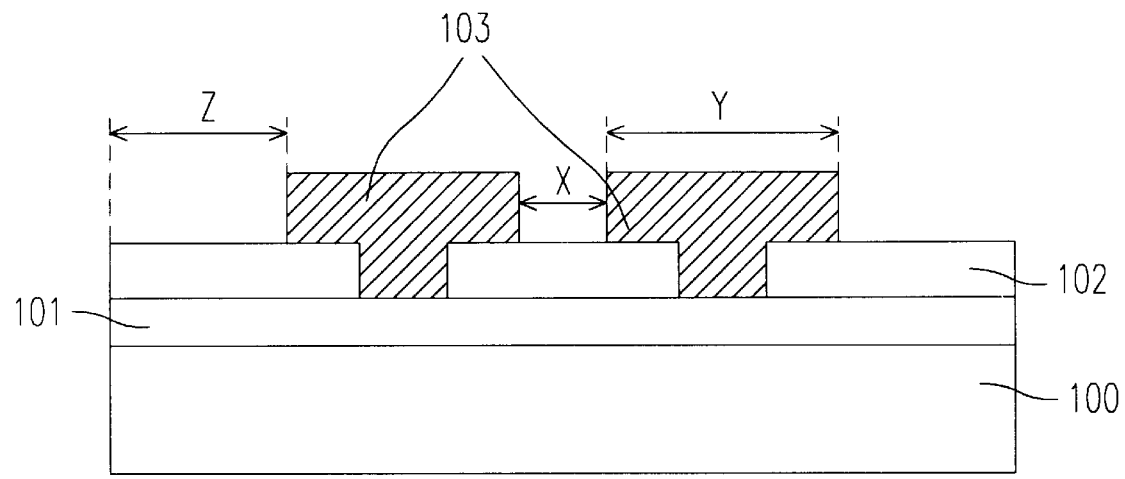

In FIG. 5, the steps include: a) forming a photoresist 103 with an interval x of 0.4 $\mu$m and a linewidth y of 0.9 $\mu$m over the polysilicon 102 after horizontally shifting the mask which is the same as that used for the first photolithographic process by a distance z of 0.65 $\mu$m during the second photolithographic process. Of course, the used mask for the second photolithographic process can be different from that for the first photolithographic so that the polysilicon with different line width can be formed.

Figure 6:
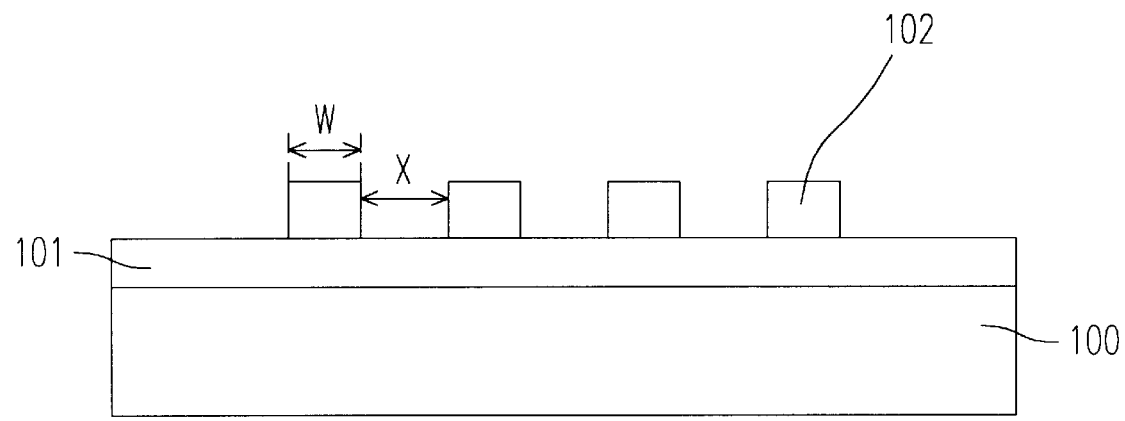

FIG. 6 shows a step to remove another portion of the polysilicon 102 that is not covered by the photoresist 103 by suitable etching techniques to form the polysilicon 102 with an interval x of 0.4 $\mu$m and a linewidth w of 0.25 $\mu$m. The linewidth w of the polysilicon 102 after the second etching process is smaller than that of the polysilicon 102 after the first etching process because the position of the photoresist 103 is shifted by 0.65 $\mu$m. The light source used for the first and second photolithographic process can be G-line (436 nm), I-line (365 nm), Deep UV (248 nm), or X-ray.

Figure 7:
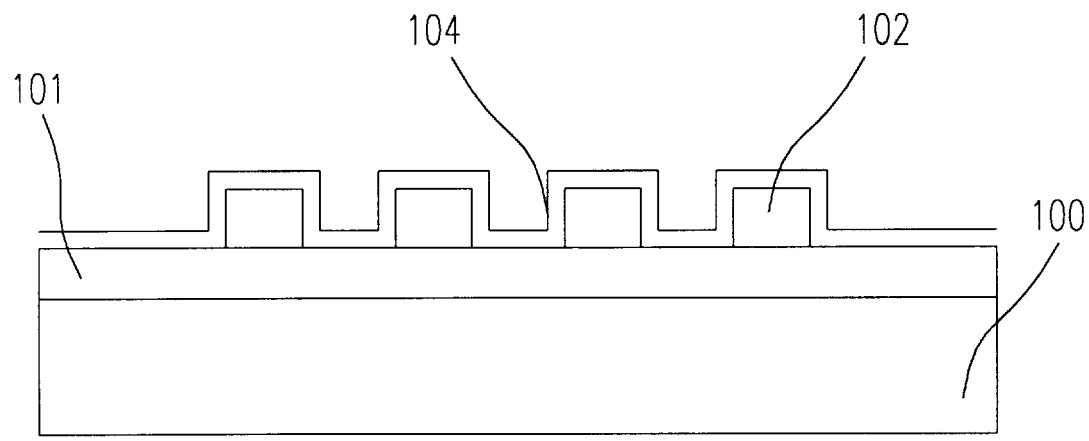

FIG. 7 shows a step to form a polysilicon film 104 over the polysilicon, wherein the thickness $\Delta w$ of the polysilicon film 104 is ranged from 50 Å to 1000 Å.

Figure 8:
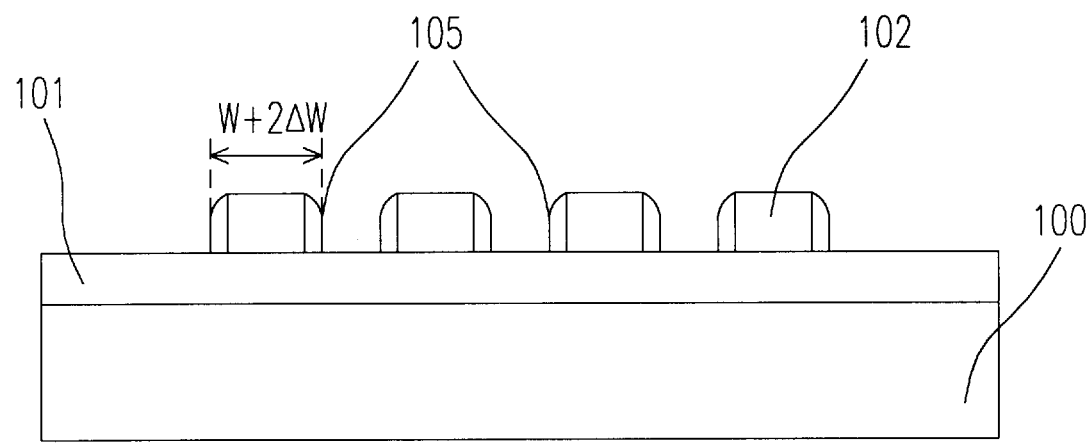

FIG. 8 shows a step to remove a portion of the polysilicon film 104 to form sidewalls 105 of the polysilicon 102 by anisotropic etch. The sidewalls 105 of the polysilicon 102 can be used to adjust the line width w of the polysilicon to w+2$\Delta$w. Finally, the line width is ranged from 0.26 $\mu$m to 0.45 $\mu$m.

The characteristics of the method for manufacturing a polysilicon with relatively small line width according to the present invention are described as follows:

1. The polysilicon with relatively small line width can be easily formed without using any specific light source for photolithography and can reduce the layout area of the integrated circuit and the manufacturing cost.
2. The minimum interval and linewidth will not be limited to the used light source for photolithography.
3. The linewidth of the polysilicon can be further adjusted by the sidewalls of the polysilicon.
4. Due to the geometric feature of the sidewalls of the polysilicon, it can avoid generating a gap between two lines of the polysilicon when other insulator is deposited thereon.
5. The lines of the polysilicon are covered by the sidewalls of the polysilicon that can protect the interface between tungsten silicide and the polysilicon from being peeled by subsequent high temperature oxidation.

Therefore, the method for manufacturing a polysilicon with relatively small line width according to the present invention can be applied to different kinds of the semiconductor products such as logic products or mask read only memory (mask ROM). It is very effective to minimize the layout area of the integrated circuit and it can form the polysilicon with a smaller pattern by using a bigger pattern for photolithography and etching technology, for example, forming the polysilicon with relatively small line width less than 0.35 $\mu$m by using I-line.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a polysilicon with a relatively small line width, formed on an insulator formed on a substrate, comprising steps of:

(a) forming a first layer of photoresist with a line pattern having a first line interval and a first line width over said polysilicon;

(b) etching a portion of said polysilicon for forming a first polysilicon with a second line interval and a second line width respectively equal to said first line interval and said first line width;

(c) forming a second layer of photoresist with a third line interval and a third lie width over said first polysilicon;

(d) etching a portion of said first polysilicon to form a fourth line interval which is equal to said third line interval, and a fourth line width;

(e) depositing a polysilicon film over said first polysilicon; and (f) etching a portion of said polysilicon film to form sidewalls of said polysilicon for adjusting said fourth line width of said polysilicon.

2. A method according to claim 1 wherein said insulator is made of one of oxide and nitride.

3. A method according to claim 1 wherein said polysilicon is a polycide.

4. A method according to claim 3 wherein said polycide is formed by chemical vapor deposition (CVD).

5. A method according to claim 3 wherein said polycide is formed by physical vapor deposition (PVD).

6. A method according to claim 1 wherein said first layer of photoresist is formed by photolithography.

7. A method according to claim 6 wherein a light source used for photolithography is one selected from a group consisting of G-line, I-line, Deep UV, and X-ray.

8. A method according to claim 1 wherein said second layer of photoresist is formed by photolithography using a mask.

9. A method according to claim 8 wherein said third line interval and said third line width of said second layer of photoresist are equal to said first line interval and said first line width respectively.

10. A method according to claim 9 wherein said second layer of photoresist with said third line interval and said third line width is formed after horizontally shifting said mask by a distance (x+y)/2, wherein x is said second line interval and y is said second line width.

11. A method according to claim 10, wherein said fourth line interval and said fourth line width of said polysilicon are equal to said second line interval x and a line width (y−x)/2 respectively.

12. A method according to claim 1 wherein said relatively small line width of said polysilicon is ranged from 0.08 $\mu$m to 0.5 $\mu$m.

13. A method according to claim 1 wherein said polysilicon film has a thickness ranged from 50 Å to 1000 Å.

14. A method according to claim 1, wherein said sidewalls of said polysilicon is formed by anisotropic etch.

* * * * *